US006798230B1

(12) United States Patent
Taylor et al.

(10) Patent No.: US 6,798,230 B1
(45) Date of Patent: Sep. 28, 2004

(54) STRUCTURE AND METHOD FOR INCREASING ACCURACY IN PREDICTING HOT CARRIER INJECTION (HCI) DEGRADATION IN SEMICONDUCTOR DEVICES

(75) Inventors: Kurt Taylor, San Jose, CA (US); Jay Chan, San Francisco, CA (US); Eugene Zhao, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 10/346,461

(22) Filed: Jan. 15, 2003

(51) Int. Cl.[7] .......................... G01R 31/28; G01R 31/26
(52) U.S. Cl. ........................ 324/763; 324/765; 324/769
(58) Field of Search ................................ 324/763, 765, 324/769; 714/733, 734; 331/57

(56) References Cited

U.S. PATENT DOCUMENTS 5,625,288 A * 4/1997 Snyder et al. ............ 324/158.1
6,242,937 B1 * 6/2001 Lee et al. .................... 324/769
6,476,632 B1 * 11/2002 La Rosa et al. ............ 324/769
6,731,179 B2 * 5/2004 Abadeer et al. ............... 331/57

OTHER PUBLICATIONS

Xiao et al., "Hot–Carrier and Soft–Breakdown Effects on VCO Performance"; IEEE Transactions on Microwave Theory and Techniques vol. 50; No. 11; Nov. 2002; pp. 2453–2458.*

* cited by examiner

Primary Examiner—Ernest Karlsen
(74) Attorney, Agent, or Firm—Winstead Sechrest & Miniek P.C.

(57) ABSTRACT

Aspects for increasing accuracy in predicting HCI degradation in semiconductor devices are described. The aspects include a gated ring oscillator structure utilized to perform HCI degradation testing with controlling of the gated ring oscillator structure to isolate voltage acceleration degradation from frequency degradation directly during the HCI degradation testing. Further included is a plurality of ring oscillators coupled in series, and first and second control logic for the plurality of ring oscillators for enabling selection of gated operation of the plurality of ring oscillators, wherein each ring oscillator performs a same number of transitions to allow an accurate assessment of HCI degradation based solely on voltage acceleration.

21 Claims, 2 Drawing Sheets

STRUCTURE AND METHOD FOR INCREASING ACCURACY IN PREDICTING HOT CARRIER INJECTION (HCI) DEGRADATION IN SEMICONDUCTOR DEVICES

FIELD OF THE INVENTION

The present invention relates to increasing accuracy in predicting hot carrier injection (HCI) degradation in semiconductor devices.

BACKGROUND OF THE INVENTION

In the course of enhancing semiconductor device design and performance, faster circuit operation has been achieved with the reduction of transistor sizes. For designers, attempts to continue to improve device performance face increasing challenges as further reductions in transistor sizes are sought. For example, it is commonly known that a problem with hot carrier injection increases as device sizes shrink.

Hot carrier injection (HCI) occurs as a result of the reduced channel size of sub-micron transistors causing an increase in the electric field, which can allow the carrier to be injected into the gate oxide of the transistor. Over time, the resulting charged gate oxide causes device degradation, raising the threshold voltage and reducing the transconductance. Device testing attempts to determine the rate of degradation due to HCI.

A known method to determine the rate of degradation due to HCI involves the use of an inverter ring oscillator. FIG. 1 illustrates a typical configuration of an inverter ring oscillator circuit 10 that includes an AND gate 11 and an odd number of CMOS inverters 12 connected in cascade to form a loop. The series of inverters 12 causes the output signal of the inverter ring oscillator 10 to oscillate/'ring' between an applied voltage potential and a ground potential. In operation, the inverter ring oscillator 10 is subjected to high voltage stress to evaluate frequency degradation and determine the voltage acceleration effect on HCI in CMOS integrated circuits. Specifically, the CMOS circuits are only subjected to the HCI damage sufficiently during the transitions, and the number of transitions depends on the stress voltages, with an increase in voltage increasing the number of transitions. While the degradation due to frequency is reflected by running the ring oscillators circuits at various voltages, the application of the differing voltages reduces the ability to detect degradation due to the voltage itself. Thus, because the typical ring oscillators run through different numbers of transitions under different stress voltages, the frequency degradation lifetime calculation is confounded with voltage acceleration and the different number of transitions.

To obtain a more accurate voltage acceleration factor due to HCI, a need exists for a test structure that can isolate the voltage acceleration factor directly during HCI degradation testing. The present invention addresses such a need.

SUMMARY OF THE INVENTION

Aspects for increasing accuracy in predicting HCI degradation in semiconductor devices are described. The aspects include a gated ring oscillator structure utilized to perform HCI degradation testing with controlling of the gated ring oscillator structure to isolate voltage acceleration degradation from frequency degradation directly during the HCI degradation testing. Further included is a plurality of ring oscillators coupled in series, and first and second control logic for the plurality of ring oscillators for enabling selection of gated operation of the plurality of ring oscillators, wherein each ring oscillator performs a same number of transitions to allow an accurate assessment of HCI degradation based solely on voltage acceleration.

With the present invention, the accuracy in predicting HCI degradation, such as in microprocessors, using ring oscillator test structures is increased by increasing the accuracy of the extracted voltage acceleration coefficient from ring oscillators. The test structure, which includes gated ring oscillators in the present invention, allows control over the logic transitions, so that by going through the same number of logic transitions, the AC HCI stress experiment undergoes true voltage acceleration. These and other advantages of the present invention will become readily apparent from the following detailed description and accompanying drawings.

DETAILED DESCRIPTION OF THE INVENTION

The present invention relates to increasing accuracy in predicting HCI degradation in semiconductor devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 2:
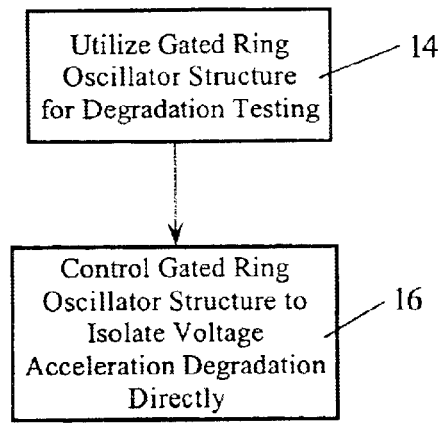
FIG. 2 illustrates a method for increasing accuracy in predicting HCI degradation in semiconductor devices in accordance with the present invention.

The present invention provides a gated ring oscillator test structure that is intended to have the ring oscillators run through the same number of transitions under different stress voltages. As shown in FIG. 2, the present invention includes utilizing a gated ring oscillator structure to perform HCI degradation testing (step 14), and controlling the gated ring oscillator structure to isolate voltage acceleration degradation from frequency degradation directly during the HCI degradation testing (step 16), as described in more detail with reference to the test structure representation in FIG. 3.

Figure 1:
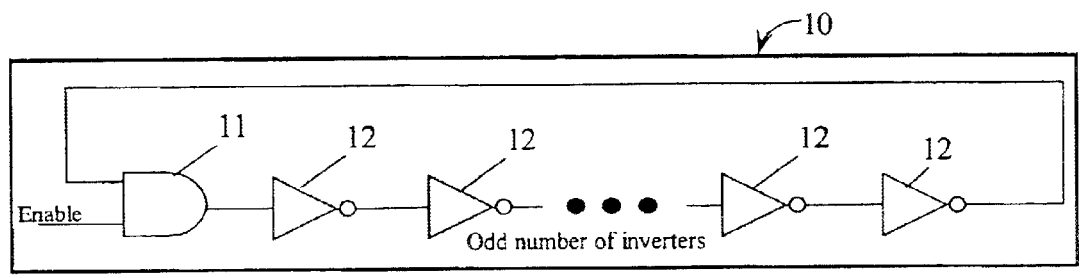
FIG. 1 illustrates a prior art ring oscillator circuit.
Figure 3:
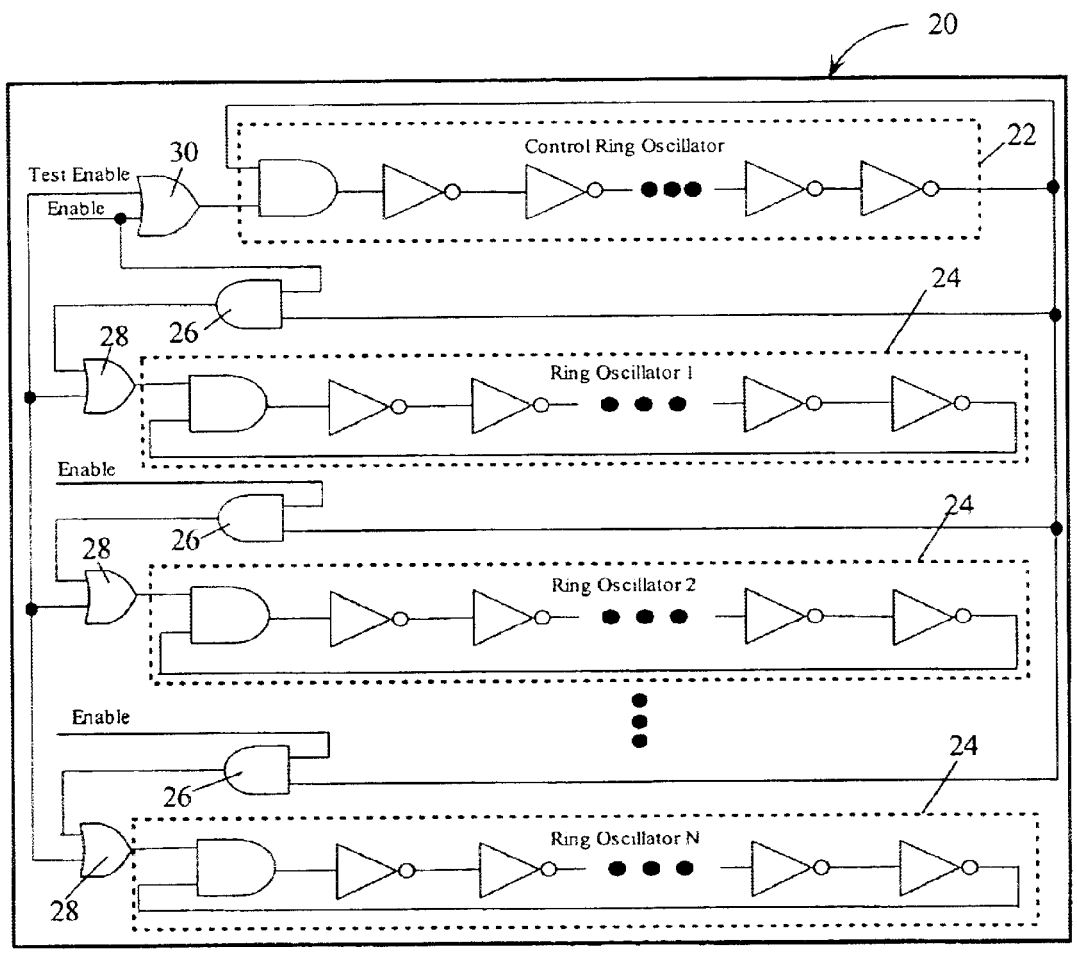
FIG. 3 illustrates a test structure for increasing accuracy in predicting HCI degradation in semiconductor devices in accordance with the present invention.

Referring now to FIG. 3, a gated ring oscillator test structure 20 in accordance with a preferred embodiment includes multiple ring oscillators, such as described with reference to FIG. 1, shown as a control ring oscillator 22 and ring oscillators 24, labelled 1 to N, coupled in series and each having a substantially identical ring oscillator circuit. The control ring oscillator 22 accounts for the reduced speed effects due to the control circuitry (not shown) that supplies the Test Enable and Enable signals, as is well understood by those skilled in the art.

It should be appreciated that although a ring oscillator circuit is described as a preferred embodiment for generating a frequency for gating the ring oscillators, other circuitry capable of generating a control frequency for gating, such as a pulse generator, could also be used. Further, while inverter ring oscillators are used for the description of a preferred embodiment, other ring oscillators, such as NAND or NOR, can also be used, as is well understood by those skilled in the art.

With the gated ring oscillator structure 20 of the present invention, all of the ring oscillators 24 will be gated by the slowest ring oscillator, i.e., the control ring oscillator 22, since the output of each ring oscillator 24 is coupled to the next succeeding ring oscillator in the structure 20 starting from the control ring oscillator 22 via output control logic 26, e.g., via an AND gate for each ring oscillator. The output control logic 26 combines the output signal from the previous ring oscillator 24 and the Enable signal and outputs a signal to input control logic 28, e.g., OR gates. With the input control logic 28, the levels of output signal from control logic 26 and the Test Enable signal determine how the ring oscillators 24 perform, while the control ring oscillator 22, as the first oscillator in the ring structure 20, is controlled by the level of the Enable or Test Enable signals via control logic 30 (e.g., an OR gate).

For example, suppose that control ring oscillator 22, and ring oscillators 24, i.e., Ring Oscillator 1, Ring Oscillator 2, . . . , and Ring Oscillator N, are, respectively, under stress voltages $V_{Control}$, $V_1$, $V_2$, . . . , and $V_N$ such that $V_{Control} \leq V_1 \leq V_2 \leq \ldots \leq V_N$ and the frequency of the N ring oscillators 24 must range from 1x to less than 2x of the control ring oscillator 22 frequency. The ring oscillators 22 and 24 in FIG. 3 will go through the same number of transitions when Enable is set to 1 and Test Enable is set to 0 during stress. The ring oscillators 22 and 24 will run at their own frequencies when Test Enable is set to 1 during the measurement. The resulting data from the test scenario having Enable set to 1 reflects the degradation that occurs due solely to voltage acceleration, since all of the ring oscillators go through the same number of transitions. Therefore, the AC HCI testings with these gated ring oscillators project device lifetime accurately from the high stress voltages to normal operating voltage and thus correlate more closely to the HCI frequency degradation in the microprocessors.

From the foregoing, it will be observed that numerous variations and modifications may be effected without departing from the spirit and scope of the novel concept of the invention. For example, it should be appreciated that the gated ring oscillator test structure of the present invention may include buffers and/or frequency dividers on the output stages to facilitate frequency measurements, as is commonly known in the art. It is to be understood that no limitation with respect to the specific methods and apparatus illustrated herein is intended or should be inferred. It is, of course, intended to cover by the appended claims all such modifications as fall within the scope of the claims.

What is claimed is:

1. A test structure for increasing accuracy in predicting hot carrier injection (HCI) degradation in semiconductor devices, the structure comprising:
   a plurality of ring oscillators coupled in series; and
   first and second control logic for the plurality of ring oscillators, the first and second control logic enabling selection of gated operation of the plurality of ring oscillators, wherein each ring oscillator performs a same number of transitions to allow an accurate assessment of HCI degradation based solely on voltage acceleration.

2. The test structure of claim 1 wherein each of the ring oscillators comprises a substantially identical circuit and is subjected to a different stress voltage level.

3. The test structure of claim 2 wherein the stress voltage level among the plurality of ring oscillators increases from one ring oscillator to a next ring oscillator in the series.

4. The test structure of claim 3 wherein a maximum stress voltage level results in a frequency no more than twice a lowest frequency of a first oscillator in the series when the plurality of ring oscillators run in non-gated operation.

5. The test structure of claim 1 wherein the first control logic is coupled to an input of each ring oscillator and the second control logic is coupled to an output of each ring oscillator.

6. The test structure of claim 5 wherein an output of the second control logic is coupled to an input of the first control logic.

7. The test structure of claim 6 wherein the first control logic further comprises an OR gate for each of the plurality of ring oscillators.

8. The test structure of claim 7 wherein the second control logic further comprises an AND gate for each of the plurality of ring oscillators.

9. A test structure for increasing accuracy in predicting hot carrier injection (HCI) degradation in semiconductor devices, the structure comprising:
   a control ring oscillator; and
   a plurality of ring oscillators coupled in series to the control ring oscillator, wherein the control ring oscillator gates the plurality of ring oscillators at a same control frequency while each ring oscillator is subjected to a different stress voltage in order to accurately determine a voltage acceleration HCI degradation factor.

10. The test structure of claim 8 further comprising first and second control logic, the first control logic coupled to an input of each ring oscillator and the control ring oscillator and the second control logic coupled to an output of each ring oscillator and the control ring oscillator, the first and second control logic enabling selection of gated operation of the plurality of ring oscillators.

11. The test structure of claim 10 wherein an output of the second control logic is coupled to an input of the first control logic.

12. The test structure of claim 11 wherein the first control logic further comprises an OR gate for the control ring oscillator and each of the plurality of ring oscillators.

13. The test structure of claim 12 wherein the second control logic further comprises an AND gate for the control ring oscillator and each of the plurality of ring oscillators.

14. The test structure of claim 8 wherein the stress voltage increases from one ring oscillator to a next ring oscillator in the series starting from the control ring oscillator.

15. The test structure of claim 14 wherein a maximum stress voltage level results in a frequency no more than twice the control frequency when the control ring oscillator and the plurality of ring oscillators run in non-gated operation.

16. A method for increasing accuracy in predicting hot carrier injection (HCI) degradation in semiconductor devices, the method comprising:
   (a) utilizing a gated ring oscillator structure to perform HCI degradation testing; and
   (b) controlling the gated ring oscillator structure to isolate voltage acceleration degradation from frequency degradation directly during the HCI degradation testing.

17. The method of claim 16 wherein step (a) further comprises (a1) utilizing a coupled arrangement of a series of plural and substantially identical ring oscillator circuits as the gated ring oscillator structure.

18. The method of claim 17 wherein step (b) further comprises (b2) providing a different stress voltage level to each of the ring oscillator circuits.

19. The method of claim 18 wherein step (b) further comprises (b3) gating the ring oscillator circuits to run at a same frequency.

20. The method of claim 16 further comprising (c) allowing the ring oscillator circuits to run freely at differing frequencies.

21. The method of claim 20 further comprising limiting a maximum frequency among the differing frequencies to less than twice a lowest frequency.

* * * * *